United States Patent
Fitzpatrick et al.

(10) Patent No.: US 11,811,199 B2
(45) Date of Patent: Nov. 7, 2023

(54) APPARATUS AND METHODS OF DETECTING TRANSIENT DISCHARGE MODES AND/OR CLOSED LOOP CONTROL OF PULSED SYSTEMS AND METHOD EMPLOYING SAME

(71) Applicant: TRANSIENT PLASMA SYSTEMS, INC., Torrance, CA (US)

(72) Inventors: Joseph F. Fitzpatrick, Glendale, CA (US); Mark A. Thomas, Redondo Beach, CA (US); Alonzo Gomez, Los Angeles, CA (US); Jason M. Sanders, La Crescenta, CA (US)

(73) Assignee: TRANSIENT PLASMA SYSTEMS, INC., Torrance, CA (US)

( * ) Notice: Subject to any disclaimer, the term of this patent is extended or adjusted under 35 U.S.C. 154(b) by 0 days.

(21) Appl. No.: 17/684,085

(22) Filed: Mar. 1, 2022

(65) Prior Publication Data
US 2022/0285922 A1    Sep. 8, 2022

Related U.S. Application Data

(60) Provisional application No. 63/156,155, filed on Mar. 3, 2021.

(51) Int. Cl.
| | |
|---|---|
| H01T 15/00 | (2006.01) |
| H03K 3/017 | (2006.01) |
| H03H 7/06 | (2006.01) |

(52) U.S. Cl.
CPC .............. *H01T 15/00* (2013.01); *H03H 7/06* (2013.01); *H03K 3/017* (2013.01)

(58) Field of Classification Search
None
See application file for complete search history.

(56) References Cited

U.S. PATENT DOCUMENTS

| 3,660,685 A | 5/1972 | Berger |
| 3,832,568 A | 8/1974 | Wang |

(Continued)

FOREIGN PATENT DOCUMENTS

| CN | 201715597 U | 1/2011 |
| CN | 202524634 U | 11/2012 |

(Continued)

OTHER PUBLICATIONS

Gilbert, Richard A., "Novel Electrode Designs for Electrochemotherapy", Biochimica et Biophysica Acta 1334, 1997, 9-14.

(Continued)

*Primary Examiner* — Thomas J. Hiltunen
*Assistant Examiner* — Khareem E Almo
(74) *Attorney, Agent, or Firm* — Cozen O'Connor

(57) ABSTRACT

A system and method for differentiating between different modes of pulsed electrical discharges via of an amplitude to time (ATC) conversion circuit is described. A bipolar ATC circuit is used to add together the positive and negative portions of an attenuated and filtered signal derived either from the voltage or current of a pulse. Alternatively, a unipolar ATC circuit may be employed. The resulting processed signal is compared against a reference voltage to generate an output signal that is active for the amount of time that the processed signal exceeds the reference voltage. Discharge mode is determined based on three factors: did a pulse occur, if a pulse occurred when did the pulse start relative to the original pulse event, and what is the duty cycle of the pulse. Subsequent pulse generated may be controlled accordingly.

20 Claims, 8 Drawing Sheets

(56) References Cited

U.S. PATENT DOCUMENTS

| | | | |
|---|---|---|---|
| 4,433,669 A | 2/1984 | Ishikawa et al. | |
| 4,677,960 A | 7/1987 | Ward | |
| 5,157,267 A | 10/1992 | Shirata et al. | |
| 5,563,780 A | 10/1996 | Goad | |
| 6,235,249 B1 | 5/2001 | Chen | |
| 6,317,341 B1 | 11/2001 | Fraidlin et al. | |
| 6,337,673 B1* | 1/2002 | Ide | G09G 3/2942 345/60 |
| 6,426,666 B1 | 7/2002 | Li et al. | |
| 6,633,017 B1 | 10/2003 | Drummond et al. | |
| 6,831,377 B2 | 12/2004 | Yampolsky et al. | |
| 6,906,280 B2 | 6/2005 | Rosocha | |
| 7,767,433 B2 | 8/2010 | Kuthi et al. | |
| 7,817,396 B2 | 10/2010 | Tao et al. | |
| 7,901,929 B2 | 3/2011 | Kuthi et al. | |
| 7,901,930 B2 | 3/2011 | Kuthi et al. | |
| 8,056,536 B2* | 11/2011 | Nakauchi | F02P 1/086 123/406.57 |
| 8,115,343 B2 | 2/2012 | Sanders et al. | |
| 8,120,207 B2 | 2/2012 | Sanders et al. | |
| 8,212,541 B2 | 7/2012 | Perreault et al. | |
| 8,226,901 B2 | 7/2012 | Makita et al. | |
| 8,373,088 B2 | 2/2013 | Kang | |
| 8,418,668 B2 | 4/2013 | Shimizu | |
| 8,614,595 B2* | 12/2013 | Acatrinei | H02M 1/4208 327/175 |
| 8,659,335 B2* | 2/2014 | Nagarkatti | H03F 3/217 315/111.21 |
| 8,854,019 B1 | 10/2014 | Levesque et al. | |
| 8,908,401 B2 | 12/2014 | Hiltbrunner et al. | |
| 9,072,169 B1* | 6/2015 | Cobler | G01J 3/10 |
| 9,080,547 B2 | 7/2015 | Shiraishi et al. | |
| 9,345,112 B2* | 5/2016 | Chen | H05B 45/37 |
| 9,377,002 B2 | 6/2016 | Singleton et al. | |
| 9,617,965 B2 | 4/2017 | Sanders et al. | |
| 9,831,776 B1 | 11/2017 | Jiang et al. | |
| 10,072,629 B2 | 9/2018 | Sanders et al. | |
| 10,097,085 B2* | 10/2018 | Cadilhon | H03K 17/691 |
| 10,128,745 B2 | 11/2018 | Low et al. | |
| 2001/0042372 A1 | 11/2001 | Khair | |
| 2003/0116148 A1 | 6/2003 | Sakakura | |
| 2004/0182832 A1 | 9/2004 | Rosocha | |
| 2005/0218423 A1 | 10/2005 | Shimizu et al. | |
| 2005/0279337 A1 | 12/2005 | Biljenga | |
| 2006/0062074 A1 | 3/2006 | Gundersen et al. | |
| 2007/0031959 A1 | 2/2007 | Kuthi et al. | |
| 2007/0262721 A1 | 11/2007 | Camilli | |
| 2008/0203068 A1 | 8/2008 | Ukai et al. | |
| 2008/0231337 A1 | 9/2008 | Krishnaswamy et al. | |
| 2008/0274632 A1 | 11/2008 | Lenfert et al. | |
| 2009/0012727 A1 | 1/2009 | Siew et al. | |
| 2009/0126668 A1 | 5/2009 | Shiraishi et al. | |
| 2009/0126684 A1 | 5/2009 | Shiraishi et al. | |
| 2010/0038971 A1 | 2/2010 | Sanders et al. | |
| 2010/0084980 A1 | 4/2010 | Koo | |
| 2010/0156195 A1 | 6/2010 | Sanders et al. | |
| 2011/0069514 A1 | 3/2011 | Chiba | |
| 2011/0267113 A1 | 11/2011 | Carmon et al. | |
| 2012/0039747 A1 | 2/2012 | Morfill et al. | |
| 2013/0318846 A1 | 12/2013 | Atwood | |
| 2014/0109886 A1 | 4/2014 | Singleton et al. | |
| 2014/0230770 A1 | 8/2014 | Kuthi et al. | |
| 2014/0346875 A1 | 11/2014 | Chinga et al. | |
| 2015/0167623 A1 | 6/2015 | Sanders et al. | |
| 2015/0280553 A1 | 10/2015 | Giuliano et al. | |
| 2015/0369203 A1* | 12/2015 | Shiraishi | F02P 5/151 123/406.56 |
| 2016/0069320 A1 | 3/2016 | Idicheria et al. | |
| 2016/0254754 A1 | 9/2016 | Perreault et al. | |
| 2018/0269793 A1 | 9/2018 | Ahsanuzzaman et al. | |
| 2019/0032623 A1 | 1/2019 | Idicheria et al. | |
| 2019/0229615 A1 | 7/2019 | Sanders et al. | |
| 2019/0229623 A1 | 7/2019 | Tsuda et al. | |
| 2019/0230779 A1 | 7/2019 | Sanders et al. | |
| 2019/0293701 A1 | 9/2019 | Marshall et al. | |
| 2020/0359491 A1 | 11/2020 | Umstattd et al. | |

FOREIGN PATENT DOCUMENTS

| | | |
|---|---|---|
| CN | 105207256 A | 12/2015 |
| CN | 105673139 A | 6/2016 |
| JP | 2005235448 A | 9/2005 |
| JP | 2006081277 A | 3/2006 |
| JP | 2010518555 A | 5/2010 |
| JP | 2011237182 A | 11/2011 |
| JP | 2012184718 A | 9/2012 |
| JP | 2013144127 A | 7/2013 |
| JP | 2019020315 A | 2/2019 |
| KR | 10-1995-0003730 | 2/1995 |
| KR | 20100023304 A | 3/2010 |
| KR | 20100046734 A | 5/2010 |
| KR | 101846046 B1 | 4/2018 |
| WO | 2004049769 A1 | 6/2004 |
| WO | 2008055337 A1 | 5/2008 |
| WO | 2010011408 A1 | 1/2010 |
| WO | 2013134573 A1 | 9/2013 |
| WO | 2014066095 A1 | 5/2014 |
| WO | 2015095140 A1 | 6/2015 |
| WO | 2019143992 A1 | 7/2019 |
| WO | 2019144037 A1 | 7/2019 |

OTHER PUBLICATIONS

Gotoh, Tomomi, et al., "Nitric Oxide-induced Apoptosis in RAW 264.7 Macrophages Is Mediated by Endoplasmic Reticulum Stress Pathway Involving ATF6 and CHOP", The Journal of Biological Chemistry, The American Society for Biochemistry and Molecular Biology, Inc.; 2002; vol. 277, No. 14, pp. 12343-12350.

Grekhov, I.V., et al., "Formation of nanosecond high-voltage drops across semiconductor diodes with voltage recovery by a drift mechanism", Sov. Tech. Phys. Lett., 1983; vol. 9, No. 4, pp. 188-189.

Grekhov, I.V., et al., "Nanosecond semiconductor diodes for pulsed power switching", Physics—Uspekhi, Russian Academy of Sciences, 2005; vol. 48, No. 7; pp. 703-712.

Grekhov, Igor V., et al., "Physical Basis for High-Power Semiconductor Nanosecond Opening Switches", IEEE Transactions on Plasma Science, Oct. 2000; vol. 28, No. 5, pp. 1540-1544.

Gundersen, M., et al., "Nanosecond Pulse Generator Using a Fast Recovery Diode", IEEE 26th Power Modulator Conference, 2004; pp. 603-606.

Gysel, Nicholas, et al., "Particulate matter emissions and gaseous air toxic pollutants from commercial meat cooking operations", Journal of Environmental Sciences; The Research Center for Eco-Environmental Sciences, Chinese Academy of Sciences; vol. 65, 2018, pp. 162-170.

Hackam, R., et al., "Air Pollution Control by Electrical Discharges", IEEE Transactions on Dielectrics and Electrical Insulation, vol. 7, No. 5, Oct. 2000, pp. 654-683.

Hemker, R.G., et al., "Development of a Parallel Code for Modeling Plasma Based Accelerators", Proceedings of the 1999 Particle Accelerator Conference, New York, 1999; pp. 3672-3674.

Huiskamp, T., et al., "Matching a Nanosecond Pulse Source to a Streamer Corona Plasma Reactor With a DC Bias", IEEE Transactions on Plasma Science, vol. 43, No. 2, Feb. 1, 2015, 617-624.

Joshi, R.P., et al., "Electroporation Dynamics in Biological Cells Subjected to Ultrafast Electrical Pulses: A Numerical Simulation Study", Physical Review E, vol. 62, No. 1; Jul. 2000; pp. 1025-1033.

Kaltsonoudis, Christos, et al., "Characterization of fresh and aged organic aerosol emissions from meat charbroiling", Atmospheric Chemistry and Physics, vol. 17, 2017; pp. 7143-7155.

Kirkman, George F., et al., "Low pressure, light initiated, glow discharge switch for high power applications", Appl. Phys. Lett.; American Institute of Physics, 1986; vol. 49, pp. 494-495.

(56) References Cited

OTHER PUBLICATIONS

Kotnik, Tadej, et al., "Theoretical Evaluation of the Distributed Power Dissipation in Biological Cells Exposed to Electric Fields", Bioelectromagnetics, vol. 21; 2000; pp. 385-394.

Kotov, Yu A., et al., "Novel nanosecond semiconductor opening switch for megavolt repetitive pulsed power technology: experiment and applications", In Proceedings of the 9th Int. IEEE Pulsed Power Conference, Albuquerque, NM, 1993; SPIE vol. 2374; pp. 98-103.

Kuroki, Tomoyuki, et al., "Single-Stage Plasma-Chemical Process for Particulates, Nox, and SOx Simultaneous Removal", IEEE Transactions on Industry Applications, vol. 38, No. 5, Sep./Oct. 2002, pp. 1204-1209.

Kuthi, A., et al., "Nanosecond pulse generator using a fast recovery diode", Power Modulator Symposium, 2004 and 2004 High-Voltage Workshop. Conference Record of the 26th International San Francisco, CA May 23-26, 2004; IEEE, pp. 603-606.

Lee, Jun-Bok, et al., "Emission Rate of Particulate Matter and Its Removal Efficiency by Precipitators in Under-Fired Charbroiling Restaurants", TheScientificWorldJOURNAL, TSW Environment; 2011, vol. 11, pp. 1077-1088.

Li, Aimin, et al., "Gene Expression Networks Underlying Retinoic Acid-Induced Differentiation of Human Retinoblastoma Cells", Investigative Ophthalmology & Visual Science, Mar. 2003; vol. 44, No. 3, pp. 996-1007.

Li, Aimin, et al., "Retinoic Acid Upregulates Cone Arrestin Expression in Retinoblastoma Cells through a Cis Element in the Distal Promoter Region", Investigative Ophthalmology & Visual Science, May 2002; vol. 43, No. 5, pp. 1375-1383.

Lyubutin, S.K., et al., "Repetitive Nanosecond All-Solid-State Pulsers Based on SOS Diodes," Institute of Electrophysics; Russian Academy of Sciences, Ural Division; IEEE 11th International Pulsed Power Conference, Baltimore, MD, 1997, pp. 992-998.

Marcu, Laura, et al., "Photobleaching of Arterial Fluorescent Compounds: Characterization of Elastin, Collagen and Cholesterol Time-resolved Spectra during Prolonged Ultraviolet Irradiation", Photochemistry and Photobiology, 1999; vol. 69, No. 6, pp. 713-721.

Marszalek, Piotr, et al., "Schwan equation and transmembrane potential induced by alternating electric field", Biophysical Journal, Oct. 1990; vol. 58, pp. 1053-1058.

Matsumoto, Takao, et al., "Energy Efficiency Improvement of Nitric Oxide Treatment Using Nanosecond Pulsed Discharge", IEEE Transactions on Plasma Science; vol. 38, No. 10, Oct. 2010; pp. 2639-2643.

Matsumoto, Takao, et al., "Process Performances of 2 ns Pulsed Discharge Plasma", Japanese Journal of Applied Physics vol. 5, No. 8, Aug. 1, 2011.

Maytin, Edward V., et al., "Stress-Inducible Transcription Factor CHOP/gadd153 Induces Apoptosis in Mammalian Cells via p38 Kinase-Dependent and -Independent Mechanisms", Experimental Cell Research, 2001; vol. 267, pp. 193-204.

McDonald, Jacob D., et al., "Emissions from Charbroiling and Grilling of Chicken and Beef", Journal of the Air & Waste Management Association, 2003; vol. 53, No. 2, pp. 185-194.

Mohapatro, Sankarsan, et al., "Nanosecond pulse discharge based nitrogen oxides treatment using different electrode configurations", The Institution of Engineering and Technology, vol. 2, No. s 2, Jun. 1, 2017, 60-68.

Moll, John L., et al., "Physical Modeling of the Step Recovery Diode for Pulse and Harmonic Generation Circuits", Proceedings of the IEEE, Jul. 1969; vol. 57, No. 7, pp. 1250-1259.

Oberdorster, Gunter, et al., "Nanotoxicology: An Emerging Discipline Evolving from Studies of Ultrafine Particles", Environmental Health Perspectives, vol. 113, No. 7; Jul. 2005; pp. 823-839.

Perryman, Pamela, "Preliminary Draft Staff Report: Proposed Amended Rule 1138 - Control of Emissions from Restaurant Operations", South Coast Air Quality Management District; Planning, Rule Development, and Area Sources, Aug. 2009, in 27 pages.

Pogue, Brian W., et al., "In Vivo NADH Fluorescence Monitoring as an Assay for Cellular Damage in Photodynamic Therapy", Photochemistry and Photobiology, 2001; vol. 74, No. 6, pp. 817-824.

Polevaya, Yulia, et al., "Time domain dielectric spectroscopy study of human cells II. Normal and malignant white blood cells", Biochimica et Biophysica Acta, 1999; vol. 1419, pp. 257-271.

Pope III, C. Arden, et al., "Lung Cancer, Cardiopulmonary Mortality, and Long-term Exposure to Fine Particulate Air Pollution", JAMA, Mar. 6, 2002; vol. 287, No. 9, pp. 1132-1141.

Rajanikanth, B.S., et al., "Discharge Plasma Treatment for NOx Reduction from Diesel Engine Exhaust: A Laboratory Investigation", IEEE Transactions on Dielectrics and Electrical Insulation, vol. 12, No. 1; Feb. 2005, pp. 72-80.

Rukin, S.N., "High-Power Nanosecond Pulse Generators Based on Semiconductor Opening Switches (Review)", Instruments and Experimental Techniques, 1999; vol. 42, No. 4, pp. 439-467.

Samet, Jonathan M., et al., "Fine Particulate Air Pollution and Mortality in 20 U.S. Cities, 1987-1994", The New England Journal of Medicine, Massachusetts Medical Society; Dec. 14, 2000; vol. 343, No. 24, pp. 1742-1749.

Sanders, J., et al., "Broadband Power Measurement of High-Voltage, Nanosecond Electric Pulses for Biomedical Applications", IEEE International Power Modulator Conference, Las Vegas, NV, 2008; pp. 350-353.

Schoenbach, Karl H., et al., "The Effect of Pulsed Electric Fields on Biological Cells: Experiments and Applications", IEEE Transactions on Plasma Science, Apr. 1997; vol. 25, No. 2, pp. 284-292.

Tang, Tao, et al., "Diode Opening Switch Based Nanosecond High Voltage Pulse Generators for Biological and Medical Applications", IEEE Transactions on Dielectrics and Electrical Insulation, Aug. 2007; vol. 14, No. 4; pp. 878-883.

Wakita, Masayoshi, et al., "Some Characteristics of the Fluorescence Lifetime of Reduced Pyridine Nucleotides in Isolated Mitochondria, Isolated Hepatocytes, and Perfused Rat Liver In Situ", J. Biochem., 1995; vol. 118, No. 6, pp. 1151-1160.

Wang, Fei, et al., "Solid-State High Voltage Nanosecond Pulse Generator," IEEE Pulsed Power Conference, 2005, pp. 1199-1202.

Watanabe, Kenji, et al., "Feasibility and limitations of the rat model by C6 gliomas implanted at the subcutaneous region", Neurological Research; Jul. 2002, vol. 24, No. 5; pp. 485-490.

Weaver, James C., et al., "Theory of electroporation: A review", Bioelectrochemistry and Bioenergetics, 1996; vol. 41, pp. 135-160.

Webb, S.E.D., et al., "A wide-field time-domain fluorescence lifetime imaging microscope with optical sectioning", Review of Scientific Instruments, Apr. 2002; vol. 73, No. 4, pp. 1898-1907.

Weiss, Arthur, et al., "The role of T3 surface molecules in the activation of human t cells: a two-stimulus requirement for IL 2 production reflects events occurring at a pre-translational level", The Journal of Immunology, vol. 133, No. 1; Jul. 1984, pp. 123-128.

Yamashita, H., et al., "Characteristics of negative-polarity DC superimposed nanosecond discharge and its applications", 2019 IEEE Pulsed Power & Plasma Sciences (PPPS), Jun. 23, 2019, 1-4.

Yancey, J.W.S., et al., "Cookery method and endpoint temperature can affect the Warner-Bratzler shear force, cooking loss, and internal cooked color of beef semimembranosus and infraspinatus steaks", J. Anim. Sci. 2016, vol. 94, pp. 4434-4446.

Zhu, Xuemei, et al., "Mouse cone arrestin gene characterization: promoter targets expression to cone photoreceptors", FEBS Letters, 2002; vol. 524, pp. 116-122.

Zhu, Xuemei, et al., "The Carboxyl Terminal Domain of Phosducin Functions as a Transcriptional Activator", Biochemical and Biophysical Research Communications, 2000; vol. 270, pp. 504-509.

Extended European Search Report dated Jul. 16, 2021 for corresponding EP Application No. 19838770.6, 27 pages.

Extended European Search Report for European Application No. 09800737.0 dated Apr. 25, 2014 in 10 pages.

Extended European Search Report, dated Dec. 18, 2020, for European Application No. 20197970.5, 11 pages.

Extended European Search Report, dated Sep. 20, 2021, for European Application No. 19741949.2-1211, 5 pages.

Hewlett Packard. Application Note 918, Pulse and Waveform Generation with Step Recovery Diodes. Oct. 1984. 28 pages.

(56) References Cited

OTHER PUBLICATIONS

International Search Report & Written Opinion for PCT/US2020/030540, dated Aug. 12, 2020, 12 pages.
International Search Report and Written Opinion for PCT/US2013/064955 dated Jan. 21, 2014 in 7 pages.
International Search Report and Written Opinion for PCT/US2019/014273 dated May 9, 2019 in 10 pages.
International Search Report and Written Opinion for PCT/US2019/014339 dated May 8, 2019 in 11 pages.
International Search Report and Written Opinion for PCT/US2019/041228, dated Nov. 12, 2019, 10 pages.
International Search Report for PCT/US2014/070518, dated Mar. 31, 2015, 2 pages.
International Search Report from PCT Application No. PCT/US2009/045073 dated Jan. 28, 2010 in 2 pages.
Kuthi, Andras, U.S. Appl. No. 61/767,044, filed Feb. 20, 2013, "Transient Plasma Electrode for Radical Generation." 7 pages.
Written Opinion for PCT/US2014/070518, dated Mar. 31, 2015, 4 pages.
Babaie, Meisam, et al., "Effect of Pulsed Power on Particle Matter in Diesel Engine Exhaust Using a DBD Plasma Reactor", IEEE Transactions on Plasma Science, vol. 41, No. 8; Aug. 2013, pp. 2349-2358.
Babaie, M., et al., "Influence of non-thermal plasma after-treatment technology on diesel engine particulate matter composition and NOx concentration", Int. J. Environ. Sci. Technol. 2016, vol. 13; pp. 221-230.
Barth, Rolf F., "Rat brain tumor models in experimental neuro-oncology: The 9L, C6, T9, F98, RG2 (D74), RT-2 and CNS-1 Gliomas", Journal of Neuro-Oncology, 1998; vol. 36, pp. 91-102.
Behrend, M.R., et al., "Nanosecond Pulse Generator Using Fast Recovery Diodes for Cell Electromanipulation", IEEE Transactions on Plasma Science, IEEE Service Center, Piscataway, New Jersey; vol. 33, No. 4, Aug. 1, 2005, pp. 1192-1197.
Bier, Martin, et al., "Kinetics of Sealing for Transient Electropores in Isolated Mammalian Skeletal Muscle Cells", Bioelectromagnetics, vol. 20, 1999; pp. 194-201.
Borner, Markus M., et al., "The detergent Triton X-100 induces a death pattern in human carcinoma cell lines that resembles cytotoxic lymphocyte-induced apoptosis", FEBS Letters (1994), vol. 353, pp. 129-132.
Chae, J.-O., "Non-thermal plasma for diesel exhaust treatment", Journal of Electrostatics, Slesvier Science B.V., vol. 57, 2003, pp. 251-262.
Chang, J.S., "Physics and chemistry of plasma pollution control technology", Plasma Sources Science and Technology; IOP Publishing, vol. 17, 2008; pp. 1-6.
Chow, Judith C., et al., "Health Effects of Fine Particulate Air Pollution: Lines that Connect", Journal of the Air & Waste Management Association, 2006; vol. 56, No. 10, pp. 1368-1380.
Cole, M.J., et al., "Time-domain whole-field fluorescence lifetime imaging with optical sectioning", Journal of Microscopy, vol. 203, Pt 3, Sep. 2001, pp. 246-257.
Cossarizza, Andrea, et al., "Chapter 21: Analysis of Mitochondria during Cell Death", Methods in Cell Biology, vol. 63, 2001; pp. 467-486.
Craft, Cheryl M., et al., "PhLPs and PhLOPs in the Phosducin Family of G beta gamma Binding Proteins", Biochemistry, American Chemical Society, 1998; vol. 37, pp. 15758-15772.
Cubeddu, R., et al., "Time-resolved fluorescence imaging in biology and medicine", Topical Review; Institute of Physics Publishing, Journal of Physics D: Applied Physics; vol. 35, 2002; pp. R61-R76.
DeAngelis, Lisa M., "Brain Tumors", New England Journal of Medicine, Jan. 11, 2001; vol. 344, No. 2, pp. 114-123.
DeBruin, Katherine A., et al., "Modeling Electroporation in a Single Cell. I. Effects of Field Strength and Rest Potential", Biophysical Journal, Sep. 1999; vol. 77, pp. 1213-1224.
Dockery, Douglas W., et al., "An Association Between Air Pollution and Mortality in Six U.S. Cities", The New England Journal of Medicine; Dec. 9, 1993; vol. 329, No. 24, pp. 1753-1759.
Frank, K., et al., "High-Power Pseudospark and BLT Switches", IEEE Transactions on Plasma Science, European Organization for Nuclear Research, Apr. 1988; vol. 16, No. 2, pp. 317-323.
Freeman, Scott A., et al., "Theory of Electroporation of Planar Bilayer Membranes: Predictions of the Aqueous Area, Change in Capacitance, and Pore-Pore Separation", Biophysical Journal, Jul. 1994; vol. 67, pp. 42-56.
Garon, E.B., et al., 2007 In Vitro and In Vivo Evaluation and a Case Report of Intense Nanosecond Pulsed Electric Field as a Local Therapy for Human Malignancies. Int. J. Cancer, vol. 121: pp. 675-682.

* cited by examiner

APPARATUS AND METHODS OF DETECTING TRANSIENT DISCHARGE MODES AND/OR CLOSED LOOP CONTROL OF PULSED SYSTEMS AND METHOD EMPLOYING SAME

STATEMENT REGARDING FEDERALLY SPONSORED RESEARCH OR DEVELOPMENT

This invention was made with Government support under SUBCONTRACT NO. AHQ-9-82305-08 (CONTRACTING PARTY: ALLIANCE FOR SUSTAINABLE ENERGY, LLC, MANAGEMENT AND OPERATING CONTRACTOR FOR THE NATIONAL RENEWABLE ENERGY LABORATORY ("NREL") awarded by the United States Department of Energy. The Government has certain rights in the invention.

COPYRIGHT NOTICE

A portion of the disclosure of this patent document contains material that is subject to copyright protection owned Transient Plasma Systems, Inc.© Transient Plasma Systems, Inc. 2020. The copyright owner has no objection to the facsimile reproduction by anyone of the patent document or the patent disclosure, as it appears in the Patent and Trademark Office patent files or records, but otherwise reserves all copyright rights whatsoever.

TECHNICAL FIELD

This description relates to systems and methods for control of systems that produce electrical pulses, and in particular to apparatus and methods of detecting or determining transient discharge modes and/or closed loop control of systems that advantageously employ a knowledge of the transient discharge mode in subsequent operations.

BACKGROUND

Pulsed power systems that generate pulses with durations that are tens of nanoseconds and faster are typically open loop systems, allowing an operator to set parameters such as output voltage, pulse repetition rate, and number of pulses generated in a burst of pulses.

BRIEF SUMMARY

Research and development conducted by Transient Plasma Systems, Inc. (TPS) focused on developing advanced ignition sources based on nanosecond pulse technology has shown that delivering bursts of multiple high power, short duration pulses at each ignition event is an effective method for extending lean burn limits and enabling stable combustion of mixtures, resulting in higher brake thermal efficiency. In the process of conducting experiments to demonstrate the efficacy of nanosecond duration pulses to improve engine efficiency, it became clear that if a practical closed loop sense and control approach could be developed that operated under the timing constraints imposed by such short duration pulses, such closed loop sense and control approach could advantageously be employed to optimize energy delivery and Coulomb transfer through an igniter or spark-plug, advantageously extending electrode lifetime. Closed loop sense and control could, for example, advantageously be used to modify the pulse train during a burst to further improve combustion performance.

A method and circuitry have been developed to detect and/or determine what type of discharge event (i.e., mode of discharge, e.g., no discharge, transient plasma discharge, or nanosecond spark) has occurred after each pulse is delivered to an electrode. Once the type of discharge event or discharge mode has been detected and/or determined, subsequent pulses in the pulse train may be adjusted based on logic or an algorithm (e.g., a pre-programmed or defined algorithm) executed by circuitry (e.g., microcontroller (MCU)). The circuitry receives as input an indication of the type of discharge event or discharge mode and an indication of an amplitude of the most recent discharge, and in response produces outputs that modify the pulse parameters of a subsequent pulse. In at least one implementation the approach for detecting or determining a type of discharge or discharge mode that results from each individual nanosecond pulse applied to the igniter has been developed based on an amplitude-to-time conversion (ATC) circuit that produces an output that is pulse width modulated (PWM) in a way that indicates the type of discharge or discharge mode (e.g., no discharge, transient plasma discharge, or nanosecond spark) that has occurred. The ATC circuit produces a control signal that can be used to drive algorithmic decision making by a processor (e.g., MCU) to enable dynamic pulse train control.

Briefly and in general terms, the present disclosure is directed to a control system for electrical pulsed power systems where a sense circuit detects or determines what type of electrical discharge has occurred for each applied pulse in a series of pulses. A resulting signal (i.e., sense signal) is input to suitable circuitry (e.g., industrial grade microprocessor, microcontroller) that can adjust the pulse parameters of a subsequent pulse based on the input provided to the circuitry, for example via execution of an algorithm by a microcontroller.

An approach for differentiating the type of discharge or discharge mode takes advantage of the fact that a waveshape of the voltage and/or current reflected from a load has certain characteristics particular to each type of discharge or discharge mode. An attenuated signal derived from a voltage and/or current of a high-power pulse contains sufficient information to determine what type of discharge or discharge mode occurred, for example: no discharge, transient plasma discharge, or nanosecond spark. The voltage/current measurements can be made at one or more of: an output of a pulse generator, at a cable/igniter interface or cable/sparkplug interface, or anywhere along a cable that connects the pulse generator to an igniter or sparkplug.

Extracting the information from the attenuated voltage and/or current signal for use in differentiating between loads is challenging using conventional techniques, such as analog sampling and subsequent digital signal processing because of the short duration of the waveforms used in nanosecond pulse applications. Analog sampling at these speeds is expensive and sensitive to electromagnetic interference (EMI), and thus was ruled out. After evaluating several different approaches, an amplitude-to-time conversion (ATC) circuit developed by TPS was selected as the sense circuit because the ATC circuit can be made with inexpensive, rugged components suitable for automotive applications, and it is significantly more immune to EMI than conventional analog sampling circuits. Additionally, data processing using the described approach is not computationally intensive and can be done with microcontrollers (MCUs) that are typically used in automotive modules.

As disclosed herein, a closed loop pulsed power system has been developed that uses the ATC circuit to close the feedback loop by providing a pulse width modulated signal to a microcontroller (MCU) that determines the discharge mode by measuring a duration of the ATC signal. A pulse width modulated (PWM) charging circuit has been designed for the pulsed power system, enabling the pulsed power system to run off of a fixed DC input supply and to achieve output pulse amplitudes that vary as a function of the pulse width of a charging control signal. This system advantageously enables a designer to employ different algorithms that enable pulse-to-pulse voltage amplitude adjustment based on the discharge mode and amplitude of a previous pulse. The number of pulses and pulse repetition rate may also be adjusted on a pulse-by-pulse basis based on the previously detected or determined discharge mode.

A method and apparatus for sensing a discharge mode generated by a high voltage pulse applied to an igniter or sparkplug may be summarized as employing one or more amplitude to time conversion (ATC) circuits and changing an amplitude of a subsequent pulse in a pulse train based on the determined or detected discharge mode. The determined or detected discharge mode may, for example, be one of the following: no detected discharge, a transient or non-equilibrated plasma, or a spark/arc.

An input to the ATC circuit may be a signal derived from a measurement of voltage and/or current of a pulse. Where multiple ATC circuits are used, each may receive a respective input signal, derived from a measurement of voltage and/or current of a pulse, where the measurements are measured or sensed at different locations in the system (e.g., output of a pulse generator, interface of cable and igniter or sparkplug, or anywhere therebetween).

The method and apparatus may adjust a pulse amplitude of a subsequent pulse based on detected discharge mode, for instance via pulse width modulated (PWM) charging circuit (e.g., a PWM half-bridge charging circuit or PWM full-bridge charging circuit, powered by DC-DC supply). The PWM half-bridge charging circuit or PWM full-bridge charging circuit turn ON and OFF for appropriate periods of time to ramp a current through an opening switch.

The methods and apparatus may, for example, be summarized as providing a closed loop circuit approach. Either the unipolar or bipolar ATC circuits are used to generate a signal that is supplied as input to a microcontroller or other processor. The microcontroller measures a duration of the signal to determine or identify a type of discharge or discharge mode. Depending on the identified type of discharge or discharge mode, the microcontroller, executing logic (e.g., programmable logic for instance an algorithm) may decide to, for example: 1) adjust a pulse amplitude of a subsequent pulse; 2) change a pulse repetition rate; 3) end a pulse train; modify a pulse burst in a pulse train.

The foregoing summary does not encompass the claimed subject matter in its entirety, nor are the various illustrated and/or described implementations or embodiments intended to be limiting. Rather, the illustrated and/or described implementations or embodiments are provided as mere examples.

The present disclosure addresses these and other needs.

Other features of the illustrated and/or described implementations or embodiments will become apparent from the following detailed description, taken in conjunction with the accompanying drawings, which illustrate, by way of example, the principles of the illustrated and/or described implementations or embodiments.

BRIEF DESCRIPTION OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

DETAILED DESCRIPTION OF THE PREFERRED EMBODIMENTS

In the following description, certain specific details are set forth in order to provide a thorough understanding of various disclosed implementations and embodiments. However, one skilled in the relevant art will recognize that embodiments may be practiced without one or more of these specific details, or with other methods, components, materials, etc. In other instances, well-known structures associated with pulse generators, for example nanosecond pulse generators, spark ignition sources, for example spark plugs, cables that couple pulse generators to spark ignition sources, for example coaxial cables, plasma generation, gas delivery systems, and/or internal combustion engines have not been shown or described in detail to avoid unnecessarily obscuring descriptions of the implementations and embodiments.

Unless the context requires otherwise, throughout the specification and claims which follow, the word "comprise" and variations thereof, such as, "comprises" and "comprising" are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the embodiments.

Figure 1:
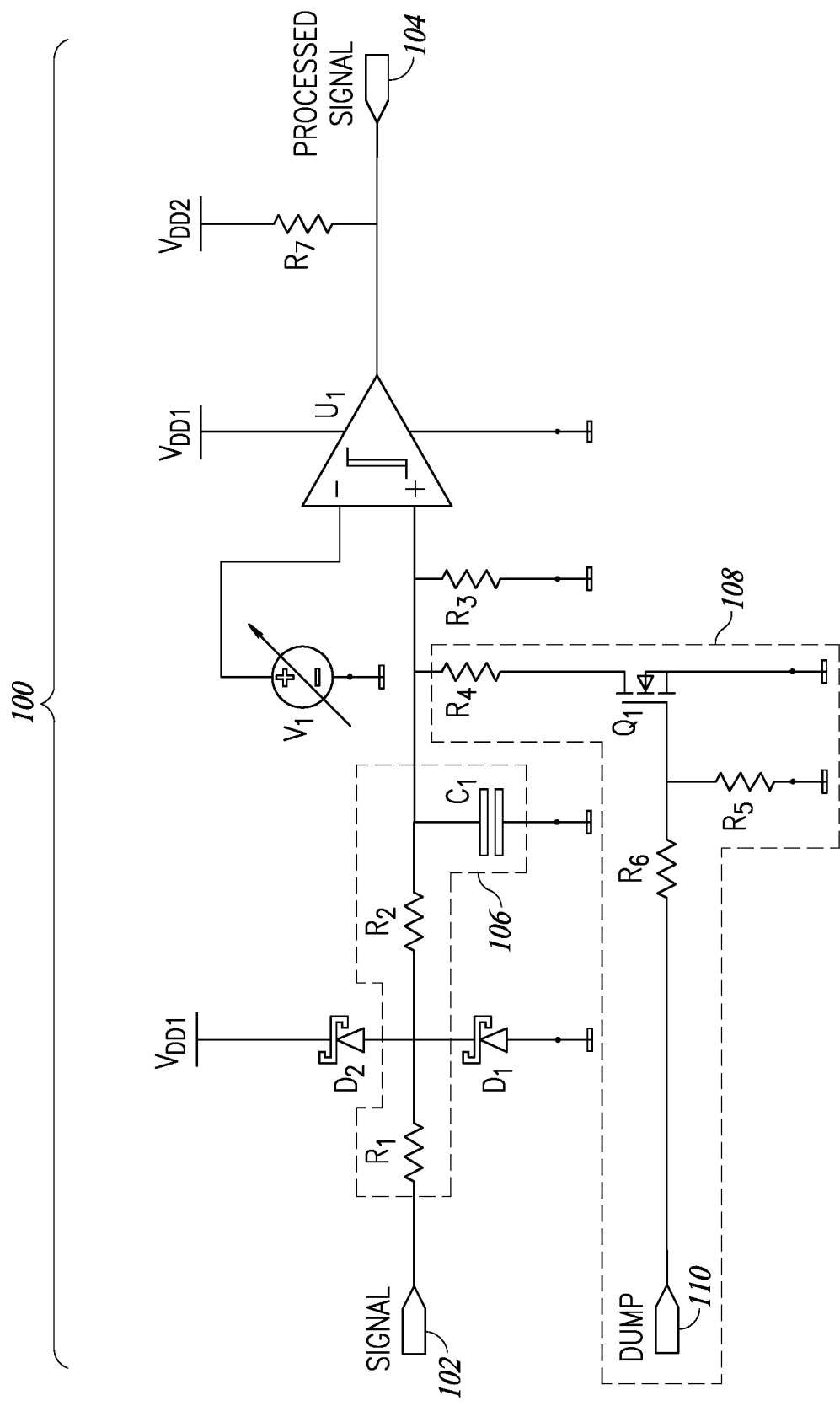
FIG. 1 is a schematic diagram showing a unipolar amplitude-to-time conversion (ATC) sense circuit, according to at least one illustrated implementation.

FIG. 1 is a schematic of a unipolar amplitude to time conversion (ATC) sense circuit 100, according to at least one illustrated implementation.

The unipolar ATC sense circuit 100 has an input terminal 102 to receive an input signal (Signal) and an output terminal 104 to provide an output signal (Processed Signal) via a comparator $U_1$. The input signal (Signal) may be supplied from a probe that measures and attenuates a high voltage pulse output from a pulse generator.

The unipolar ATC sense circuit 100 features clamping diodes $D_1$, $D_2$ at the input terminal 102, to clamp the input signal (Signal) between $-V_F$ and $V_{DD1}+V_F$, where $V_F$ is a forward voltage of the clamping diodes $D_1$ and $D_2$. This diode clamping circuit permits only unipolar, in this case positive, voltages to appear at a positive input terminal of the comparator $U_1$.

The unipolar ATC sense circuit 100 also includes a filter (encompassed by broken line box 106) comprised of resistors $R_1$ and $R_2$ and a capacitor $C_1$ to filter the input signal (Signal). The filtered and attenuated signal is input to comparator $U_1$, which compares the attenuated and filtered signal against a DC reference provided by the adjustable voltage source $V_1$. A bandwidth of the filter 106 (($R_1+R_2$)–$C_1$) and a waveshape of the input signal (Signal) work together to create outputs from the comparator $U_1$ with sufficiently discrete durations that a duration of the output (interchangeably Mode or Processed Signal) of the comparator $U_1$, can be measured and used to differentiate the type of discharge or discharge mode that has occurred. The comparator $U_1$ has an open-collector output to enable input-to-output level-shifting, enabling a wider input amplitude dynamic range, while guaranteeing an output voltage that is within nominal maximum operating limits of a set of electronics that receive the output signal (Processed Signal).

The unipolar ATC sense circuit 100 also includes a dump circuit (encompassed by broken line box 108), comprising a transistor $Q_1$, an dump input 110, and resistors $R_4$, $R_5$, $R_6$ for a clearing signal (Dump). The clearing signal (Dump) is used to gate the transistor $Q_1$ so that the capacitor $C_1$ of the filter can be rapidly discharged, and the unipolar ATC sense circuit 100 reset for a subsequent measurement, after the output signal (interchangeably Mode or Processed Signal Mode) has been processed.

In operation, the unipolar ATC circuit 100 differentiates between different types of discharges driven by an electrical pulse. The input (Signal) to the ATC circuit 100 is derived from a voltage or current of an electrical pulse. This signal looks significantly different for different discharge modes due to the differences in discharge impedance and transmission line effects from a cable that connects a pulse generator to a load (e.g., igniter, sparkplug). By filtering the attenuated signal with an R-C filter, a processed signal (Processed Signal) is derived that is compared against a buffered analog voltage reference provided by an adjustable DC voltage source $V_1$. The duration of time that the processed signal (Processed Signal) exceeds the reference voltage is different for different discharge modes. This result in output signals from the common-collector comparator $U_1$, that have different durations corresponding to the mode of discharge. The Dump input drives a transistor $Q_1$ that discharges the signal on capacitor $C_1$ to reset the ATC circuit 100 before another pulse is fired by the pulse generator. The discharge mode is determined based on three factors: did a PWM pulse occur, if a PWM pulse occurred when did the PWM pulse start relative to the original pulse event (i.e., delay), and what is the duty cycle of the PWM pulse (i.e., pulse duration).

Figure 2:
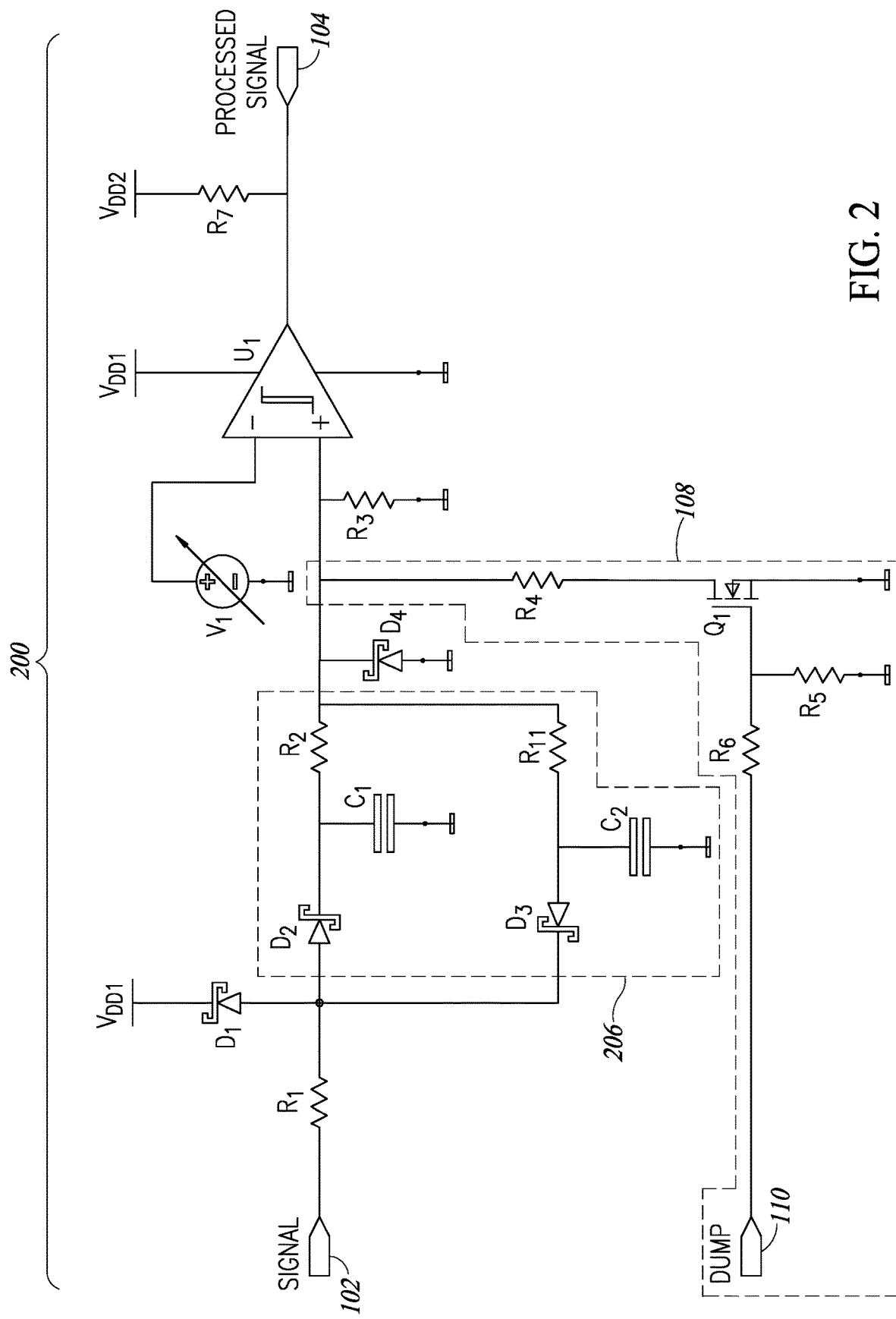
FIG. 2 is a schematic diagram showing a bipolar amplitude-to-time conversion (ATC) sense circuit, according to at least one illustrated implementation.

FIG. 2 is a schematic of a bipolar amplitude to time conversion (ATC) sense circuit 200, according to at least one illustrated implementation. As noted below, some components of the bipolar ATC circuit 200 are similar or even identical to those of the unipolar ATC circuit 100.

The bipolar ATC circuit 200 has an input terminal 102 to receive an input signal (Signal) and an output terminal 104 to provide an output signal (Processed Signal) via a comparator $U_1$. The input signal (Signal) may be supplied from a probe that measures and attenuates a high voltage pulse output from a pulse generator.

The bipolar ATC circuit 200 features a bipolar adding circuit (encompassed by broken line box 206) that sums positive and negative portions of a waveform of the input signal (Signal). The bipolar adding circuit comprises diodes $D_2$ and $D_3$, capacitors $C_1$ and $C_2$, and resistors $R_2$ and $R_{11}$.

The bipolar ATC circuit 200 also includes a diode $D_1$ that clamps a maximum positive voltage from the input (Signal) to $V_{DD1}+V_F$, where $V_F$ is a forward voltage drop of the diode $D_1$. The bipolar ATC circuit 200 also includes a diode $D_4$ that clamps the signal produced by the bipolar adding circuit to a minimum voltage of $-V_F$, where $V_F$ is a forward voltage of the diode $D_4$.

The configuration of the remaining components of the bipolar ATC circuit 200 operate in a similar fashion to the corresponding components of the unipolar ATC circuit 100 (FIG. 1), so discussion of such is not repeated in the interest of conciseness.

In operation, the rectifying diodes $D_2$, $D_3$ steer positive and negative voltage to capacitors $C_1$, $C_2$, respectively. Both positive and negative signals are low-pass-filtered by the resistor/capacitor pairs $R_1$-$C_1$ and $R_1$-$C_2$. The signals are then recombined through the resistors $R_2$, $R_{11}$ and fed into the comparator $U_1$.

It has been determined in experiments and simulations that adding the positive and negative portions of the input waveform derived from the high voltage output of the pulse generator increases versatility in the ATC circuit 200 because such enables differentiation between discharge modes measured at more measurement points in a system. Specifically, the unipolar ATC sense circuit 100 works best for input signal that are sensed in close proximity to an igniter or sparkplug because transmission line effects between a pulse generator and the igniter or sparkplug may compromise an integrity of the output signal (Processed Signal) produced by the unipolar ATC sense circuit 100 when the sensing is located spatially away from the igniter or sparkplug. In contrast, the bipolar ATC sense circuit 200 can be located anywhere between the pulse source (e.g., pulse generator) and a load (e.g., igniter or sparkplug), which is enabled by the fact that the oscillating waveforms that occur after the nanosecond duration pulse drives the igniter or sparkplug are relatively symmetric. The bipolar ATC sense circuit 200 advantageously uses rectification and summation of the two filtered waveforms, removing transmission line effects, to provide a sufficiently accurate signal with enough information to process the signal and determine discharge mode and amplitude.

A pulse amplitude of a subsequent pulse may be adjusted based on detected discharge mode, for instance via a pulse width modulated (PWM) charging circuit (e.g., a PWM half-bridge charging circuit or PWM full-bridge charging circuit, powered by DC-DC supply). The PWM half-bridge charging circuit or PWM full-bridge charging circuit turn ON and OFF for appropriate periods of time to ramp a current through an opening switch.

Figure 3:
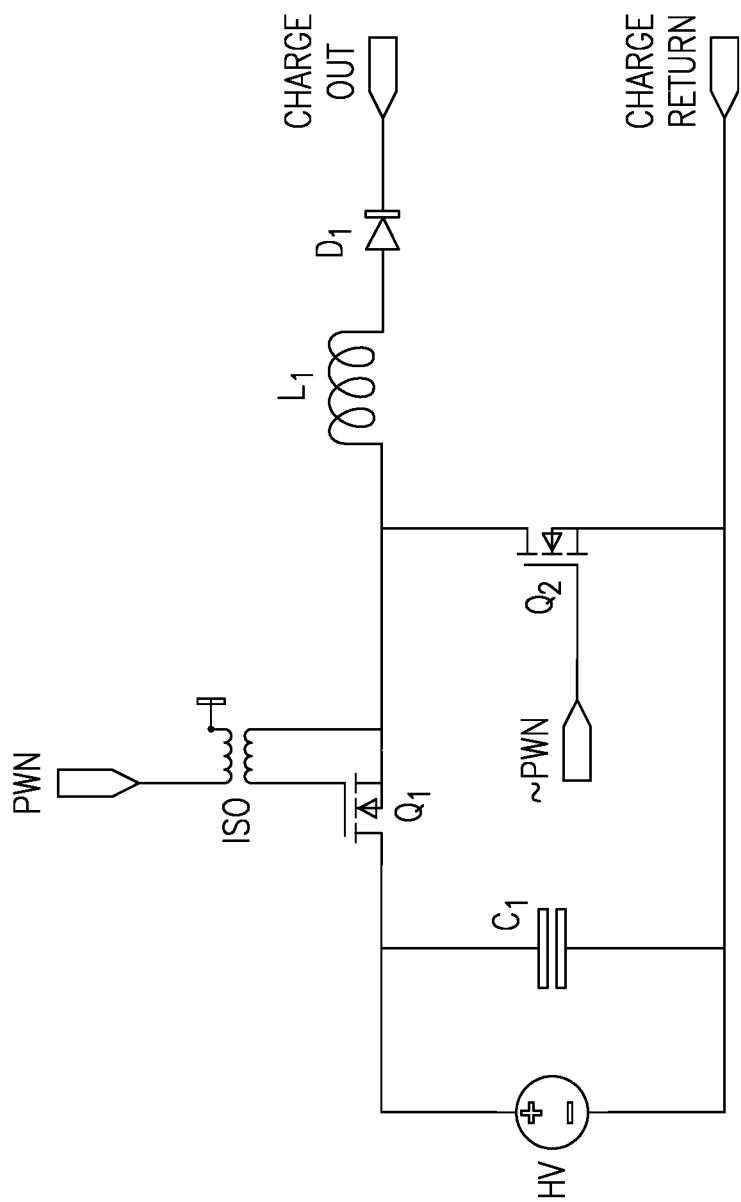
FIG. 3 is a schematic diagram showing a pulse width modulated (PWM) charging circuit according to at least one illustrated implementation, the PWM charging circuit used to adjust the output voltage amplitude and pulse energy of an output of a pulse generator.

FIG. 3 shows a pulse width modulated (PWM) charging circuit 300, according to at least one illustrated implementation.

The PWM charging circuity 300 may advantageously be used to adjust an output voltage amplitude and/or pulse energy of an output of a pulse generator. The PWM charging circuity 300 has an input terminal 302 to receive a pulse width modulated signal (PWM), a charge output terminal 304 and a charge return terminal 306. The input terminal 302 is coupled to a gate of a first transistor Q1 of the PWM charging circuity 300 via an isolation transformer ISO to supply the input signal (PWM) thereto. The input signal (PWM) is also supplied to a gate of a second transistor Q2 of the PWM charging circuity 300.

The PWM charging circuity 300 also includes a high voltage source HV, a bypass capacitor $C_1$, an inductor $L_1$, and a rectifying diode $D_1$. The high voltage source HV is electrically coupled between the charge output terminal 304 and the charge return terminal 306, via the inductor $L_1$ and the rectifying diode $D_1$. The bypass capacitor $C_1$ and the second transistor $Q_2$ are both electrically coupled in parallel with the high voltage source HV and one another. The bypass capacitor $C_1$ stores sufficient charge to supply a high frequency burst of pulses.

A duration of the input signal (PWM) may advantageously be determined using an algorithm, for example, an algorithm flashed onto a microcontroller or other processor that analyzes the output signal from an ATC sense circuit (e.g., unipolar ATC sense circuit 100, bipolar ATC sense circuit 200). Depending on the type of discharge or discharge mode determined by the microcontroller or other processor, the PWM signal is adjusted to either increase or reduce pulse amplitude and/or to end the pulse train delivered to a load (e.g., igniter or sparkplug). The sense and control circuit described herein is capable of making additional changes to pulse parameters, including, but not limited to, adjusting pulse amplitude in other ways, e.g., by adjusting a DC voltage level that is input to a charging circuit. PWM approach is one method of adjusting voltage amplitude, although other approaches may be employed.

In operation, the PWM charging circuit is gated by the microcontroller or other processor and appropriate gate drive circuitry (FIG. 3), where two transistors $Q_1$, $Q_2$, are driven by complimentary gate signals to achieve pulse width modulation. The input signal (PWM) gates the first transistor $Q_1$ to turn ON, and in response current flows through the inductor $L_1$ and the rectifying diode $D_1$. When the transistor $Q_1$ is conducting, charge is transferred from the capacitor $C_1$ through the inductor $L_1$ to the load capacitor of the pulse generator that is connected to node "Charge Out". The amount of charge transferred is regulated by the amount of time that the transistor $Q_1$ is conducting. When the transistor $Q_1$ turns OFF, the transistor $Q_2$ turns ON to provide a conducting path so that the energy stored in the inductor $L_1$ as a current may continue flowing until it is fully transferred to the load capacitance. The transistor $Q_2$ may also be replaced by a diode if the forward loss is acceptable and there is not a need for active control of this node. If the duration of input signal (PWM) is less than a half resonant period (T/2), where T is a resonant period determined by the inductor $L_1$ and the load capacitance connected to the charge output terminal 304 (Charge Out), the second transistor $Q_2$ provides a conduction path for the current flowing through the inductor $L_1$ to transfer the remaining inductively stored energy to the load capacitor connected to the charge output terminal 304 (Charge Out).

Figure 4:
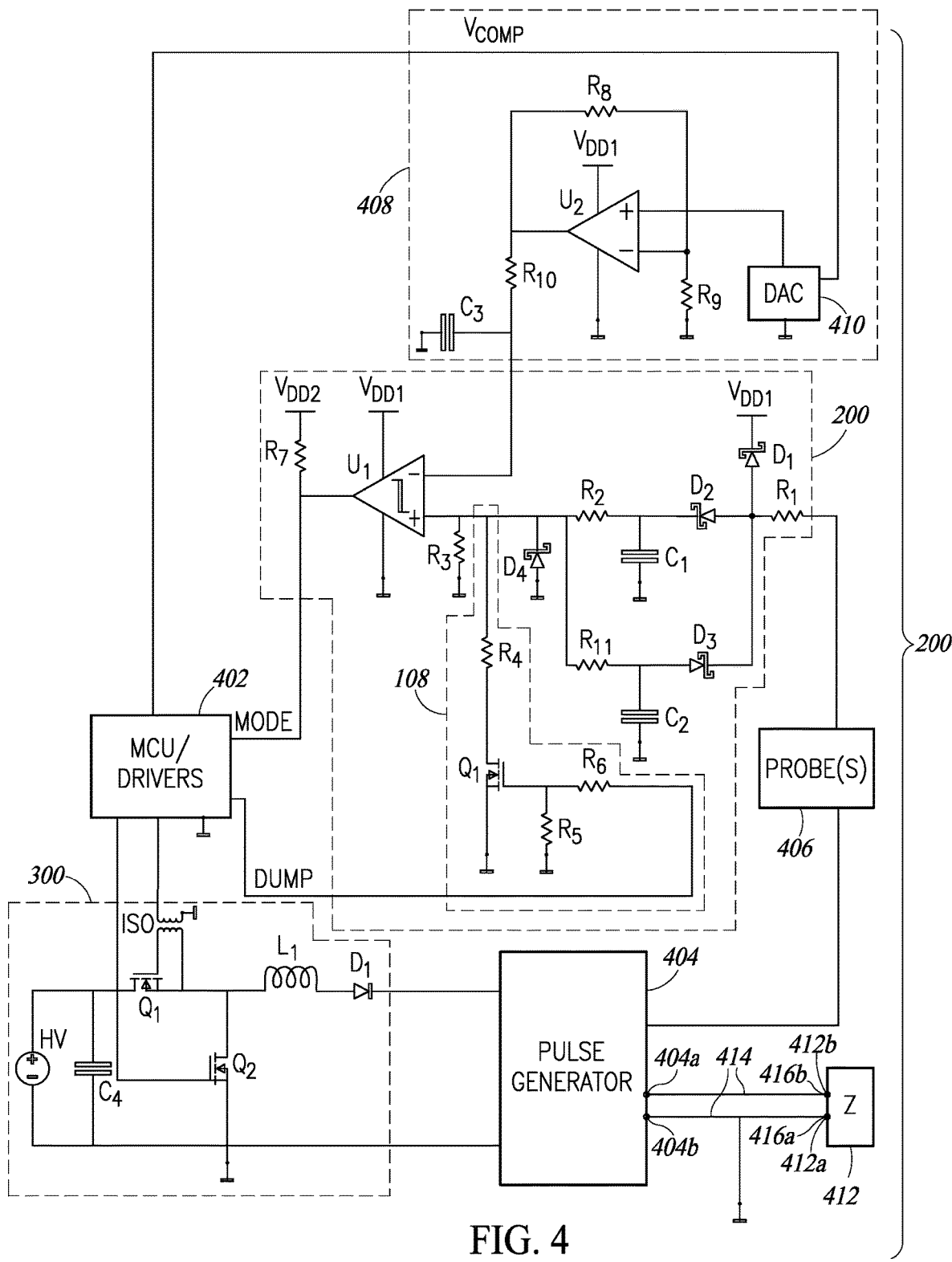
FIG. 4 is a schematic diagram showing of a system according to at least one illustrated embodiment, which uses the bipolar ATC sense circuit of FIG. 2, the PWM charging circuit of FIG. 3 and a microcontroller (MCU).

FIG. 4 shows a system 400, according to at least one illustrated implementation.

The system 400 includes the bipolar ATC sense circuit 200 (FIG. 2), the PWM charging circuit 300 (FIG. 3), a microcontroller (MCU) 402, which are operable to detect an output waveform and reflected waveforms at output electrodes 404a, 404b of a pulse generator 404, the output waveform and reflected waveforms which are sensed via one or more sensors 406 (Probe(s)), and a comparison circuit 408 which is operable to compare the signal sensed by the sensors 406 to a reference voltage level. The reference voltage level may advantageously be programmed by the MCU 402. For example, the microcontroller 402 may be communicatively coupled to a digital-to-analog converter (DAC) 410 of the comparison circuit 408, for instance to set a value of the reference voltage. The comparison circuit 408 includes a comparator U2, coupled to the DAC 410 to receive the reference voltage.

The one or more sensors 406 can include voltage sensors and/or current sensors that attenuate the signals to achieve an appropriate dynamic range determined, for example by $V_{DD1}$ of the ATC circuit 200. The one or more sensors 406 can be positioned at one, two, or even more locations from output terminals 404a, 404b of the pulse generator 404 to the input terminals 412a, 412b of a load 412 (e.g., igniter or sparkplug, represented with associated impedance Z). The output terminals 404a, 404b of the pulse generator 404 may be electrically coupled to the input terminals 412a, 412b of a load 412 via one or more cables 414, via one or more a cable/igniter or cable/sparkplug interfaces 416a, 416b. For example, one or more sensors 406 can be positioned at any one or more of: an output 404a, 404b of a pulse generator 404, a cable/igniter or cable/sparkplug interface 416a, 416b, or a location along a cable 144 that connects the pulse generator 404 to the load 412 (e.g., an igniter or a sparkplug).

In the implementation illustrated in FIG. 4, an output voltage or current are measured by a sensor 406, which attenuates the signal and feeds the attenuated input signal into the bipolar ATC circuit 200. As previously explained, the bipolar ATC circuit 200 separates the positive and negative portions of the attenuated input signal, by means of the diodes $D_2$ and $D_3$, and low pass filters both positive and negative signals by the filter formed by resistor/capacitors $R_1$-$C_1$ and $R_1$-$C_2$. The positive and negative signals are added through the resistors $R_2$ and $R_{11}$, creating a signal that the comparison circuit 408 compares against the reference voltage, for example a reference voltage derived from the DAC 410, which is programmed by the microcontroller 402.

The load impedance (Z) is that of an igniter (e.g., load 412) designed to strike a discharge when excited by the electric pulse generated by the pulse generator 404. Depending on the pressure and temperature of the ambient fuel-air mixture surrounding the igniter and the voltage, duration, and energy of the pulse, the discharge of the igniter may be one of the following types or modes: no discharge, a transient plasma or non-equilibrium discharge, or a nanosecond spark.

The bipolar sense circuit 200, described in the detailed description for FIG. 2, compares a filtered and attenuated signal derived from the output voltage or current of the pulse generator 404. This processed signal, input to the positive terminal of the comparator $U_1$, is compared against an adjustable DC reference voltage $V_1$. The different discharge modes result in a processed signal that will exceed the constant voltage reference signal for different periods of time, resulting in output waveforms from the comparator $U_1$ of different durations for different discharge modes. Thus, the durations in output waveforms from the comparator $U_1$ may be used in determining the discharge type or mode.

The output signal (Processed Signal) from the ATC circuit 200 comes from the comparator $U_1$ and is fed to the microcontroller 402. The microcontroller 402 measures the duration of the signal and bins the measured durations according to a defined logic, for example a pre-programmed algorithm. Each bin corresponds to a respective one of the discharge types or discharge modes. This microcontroller 402 is advantageously operable to identify the discharge type or discharge mode before a subsequent pulse is fired, using simple time measurements, enabling the microcontroller 402 executing an algorithm to timely decide how to either adjust to pulse amplitude, modify the pulse repetition rate, end the pulse train, or adjust the number of pulses in a burst.

To determine the discharge mode based on the signal (identified as Processed Signal in FIG. 2 and identified as Mode in FIG. 4) that is produced by the comparator $U_1$ of the bipolar ATC circuit 200 as illustrated in FIG. 4, the microcontroller 402 performs three basic tests on the signal. The first test is to determine whether comparator $U_1$ produced an output signal (Mode) during a defined test interval. The test interval is the period of time beginning when the pulse generator 404 outputs a high voltage pulse and ending at the time at which the microcontroller is programmed to trigger the pulse generator 404 to produce a subsequent pulse minus a time required to run or execute decision code/instructions. If no signal is detected during this interval, the microcontroller 402 determines that a no discharge occurred, indicating, setting or otherwise characterizing the type of discharge event or discharge mode as a no discharge event or no discharge mode. The second and third tests are only conducted if the result of the first test indicates that a signal was detected during the defined test interval. If a signal is detected, the second test performed is to measure a delay, that is the time from when the pulse generator outputs a high voltage pulse to when a rising edge of a positive square wave generated by the comparator $U_1$ occurs (i.e., when did the signal "Mode" begin relative to the generation of the high voltage pulse?). The third test is to measure a duration of the square wave signal generated by comparator $U_1$. The pulse width is indicative of the amount of time that the reference voltage is applied to the negative input terminal of comparator $U_1$, making its duration proportional to the amount of charge and/or energy deposited in the discharge. In borderline case, the duration may exceed the allowed test window (i.e., defined test interval), requiring a dump circuit 108 to discharge capacitor $C_1$ at the end of the defined test interval. In the event that the result of the first test indicates that comparator $U_1$ generated a signal, the MCU's algorithm analyzes the results from the second and third tests to determine whether the discharge should be characterized as a transient plasma/non-equilibrium discharge, or a nanosecond spark.

The methods and structures described herein advantageously require very little computational power. The methods and structures described herein advantageously employ time space, which may be measured with conventional timer and timer/capture modules commonly found in microcontrollers. Although variations are possible, a representative algorithm is set out immediately below.
1. Start of pulse sequence
   a. Release Dump feature
   b. Reset timers for pulse generation and pulse measurement
2. Start the timer(s) used for pulse generation and the timer(s) used for pulse measurement concurrently
3. Wait until the pulse repetition rate period has nearly expired
4. Check the following measurements
   a. Did a measurement pulse occur?
   b. When did the pulse occur relative to the start of timers?
   c. What is the pulse width?
5. Apply Dump feature
6. Based on the measurements, determine discharge type or discharge mode
7. Make adjustments (e.g., make algorithmic adjustments, for instance adjusting power, terminating pulse train, etc.)
8. Wait for next event If the algorithm determines to end the pulse train, the microcontroller 402 stops outputting trigger signals to the charging circuit shown in FIG. 3 and FIG. 4. If the algorithm determines that the pulse amplitude should be adjusted based on the previous discharge mode, the microcontroller 402 will change the duration of the PWM signal to transistors $Q_1$ and $Q_2$ shown in FIG. 4. A description of how the PWM circuit operates can be found above in the detailed description for FIG. 3.

Determining discharge mode is be part of a larger application. For example, the determined discharge mode may be employed in controlling the generation and/or characteristics of subsequent pulses. In at least some implementations, the microcontroller 402 may also control the generation of pulse bursts, or sequences of pulses, based on the determined discharge mode. To do so, in addition to the above described determinations (i.e., did a discharge occur, delay, duration) the system 400 may further determine when did a particular discharge mode occur relative to an overall pulse train. This permits the system 400 to not just target a particular discharge mode, but to use logic (e.g., preprogrammed algorithms) to optimize performance. For example, the system 400 may cause generation of an optimum or optimized number of non-ignition pre-pulses to achieve optimum or improved combustion chemistry. Similarly, the system 400 may cause generation of an optimum or optimized number of post combustion pulses, added to optimize or improve kernel growth for a particular air fuel mixture.

Figure 5:
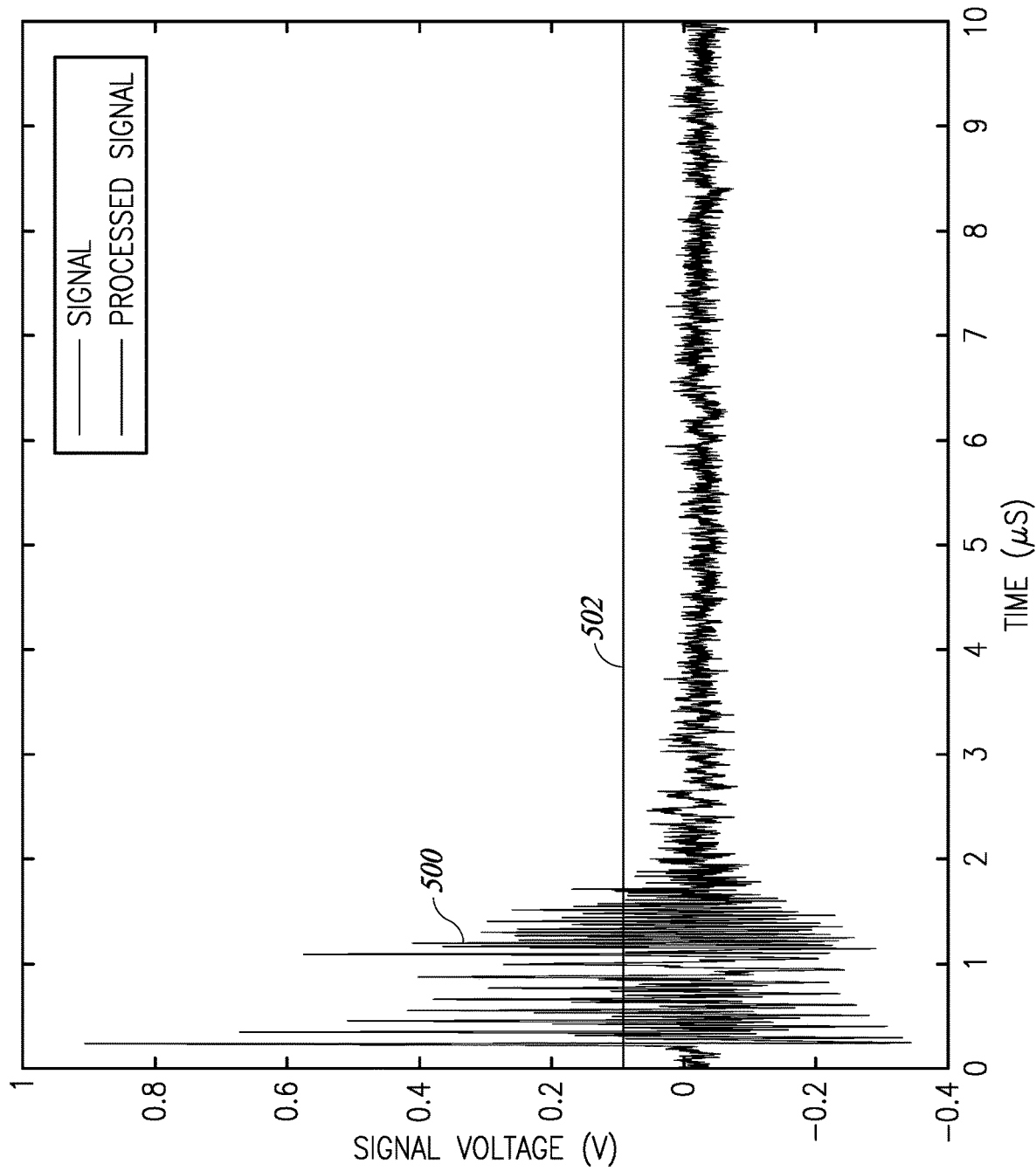
FIG. 5 is a graph showing an example plot of an output of a pulse generator where a comparator does not produce an output, indicating an occurrence of a no-discharge event type or discharge mode.

FIG. 5 shows an example plot of an output 500 of a pulse generator wherein, the comparator does not produce an output signal (i.e., Processed Signal) as indicated by flat line 502, according to at least one illustrated implementation. This corresponds to an occurrence of a no-discharge type of discharge or discharge mode.

Figure 6A:
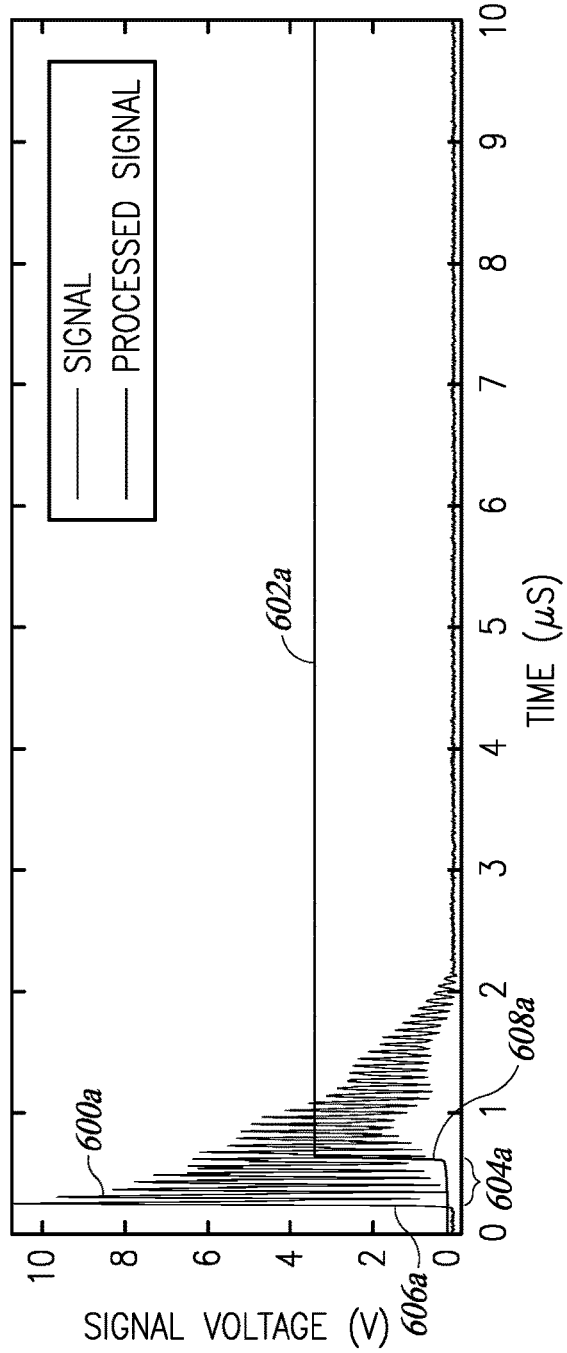
FIG. 6A is a graph showing an example of a plot of an example output of a pulse generator and an output signal of a comparator, illustrating a delay from when a discharge occurs to occurrence of a rising edge of the output signal from a comparator, according to at least one illustrated implementation.

FIG. 6A shows a plot of an example output 600a of a pulse generator and an output signal 602a (i.e., Processed Signal) of a comparator, illustrating a delay 604a from when a discharge 606a occurs to an occurrence of a rising edge 608a of the output signal 602a from the comparator, according to at least one illustrated implementation. If the comparator outputs a signal, the time of this delay 604a is measured by the microcontroller, and used as one piece of data or information in order to determine the type of discharge or discharge mode.

Figure 6B:
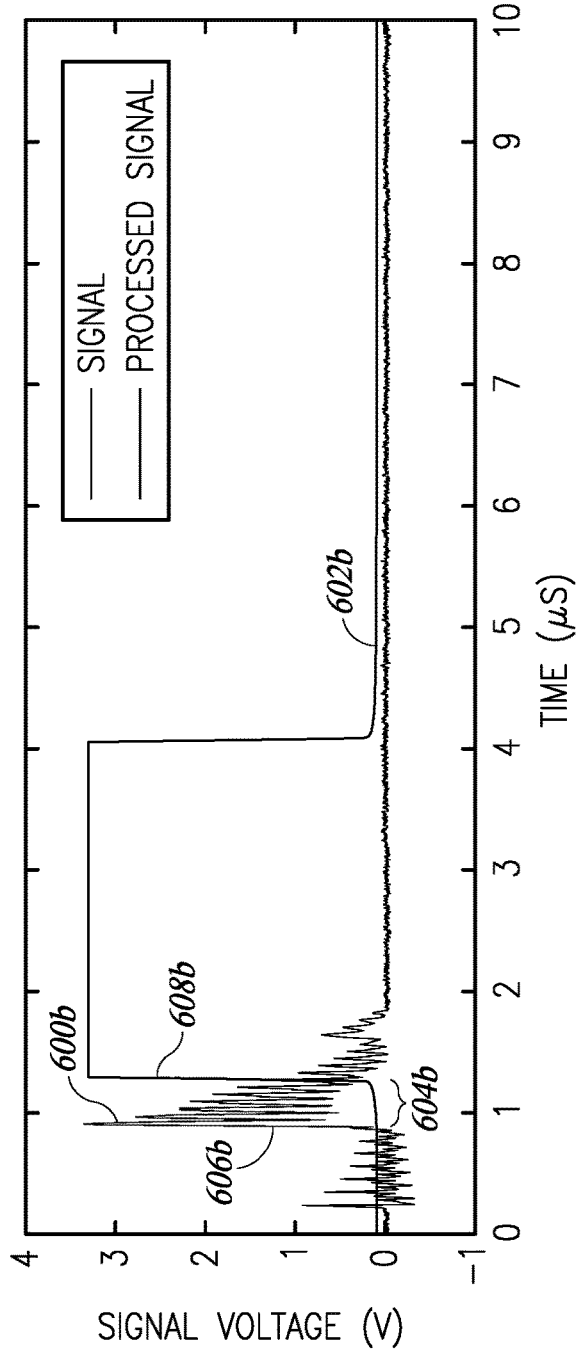
FIG. 6B is a graph showing another example of a plot of an example output of a pulse generator and an output signal of a comparator, illustrating a delay from when a discharge occurs to occurrence of a rising edge of an output signal from the comparator, according to at least one illustrated implementation.

FIG. 6B shows a plot of an example output 600b of a pulse generator and an output signal 602b (i.e., Processed Signal) of a comparator, illustrating a delay 604b from when a discharge 606b occurs to an occurrence of a rising edge 608b of the output signal 602b from the comparator, according to at least one illustrated implementation. If the comparator outputs a signal, the time of this delay 604b is measured by the microcontroller, and used as one piece of data or information in order to determine the type of discharge or discharge mode.

Figure 7A:
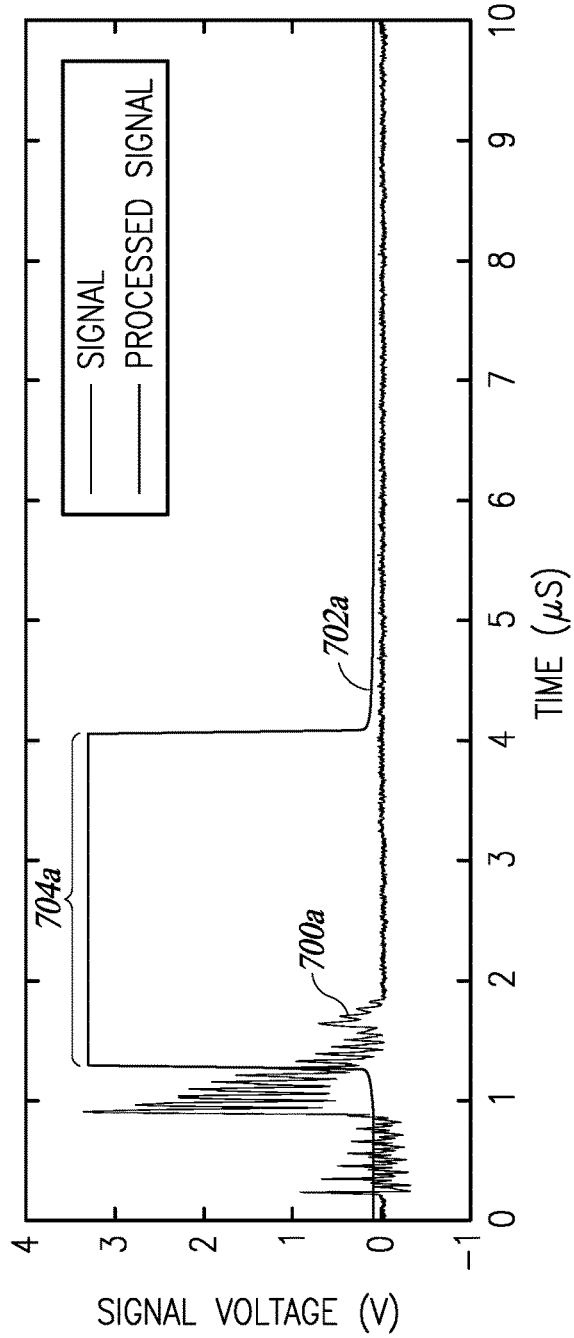
FIG. 7A is a graph showing a plot of an example output of a pulse generator and an output signal of a comparator, illustrating a pulse duration for the output signal of the comparator, according to at least one illustrated implementation.

FIG. 7A shows a plot of an example output 700a of a pulse generator and an output signal 702a (i.e., Processed Signal) of a comparator, illustrating a pulse duration 704a of the output signal 702a, according to at least one illustrated implementation. If the comparator outputs a signal, the pulse duration 704a is measured by the microcontroller, and used as one piece of data or information in order to determine the type of discharge or discharge mode.

Figure 7B:
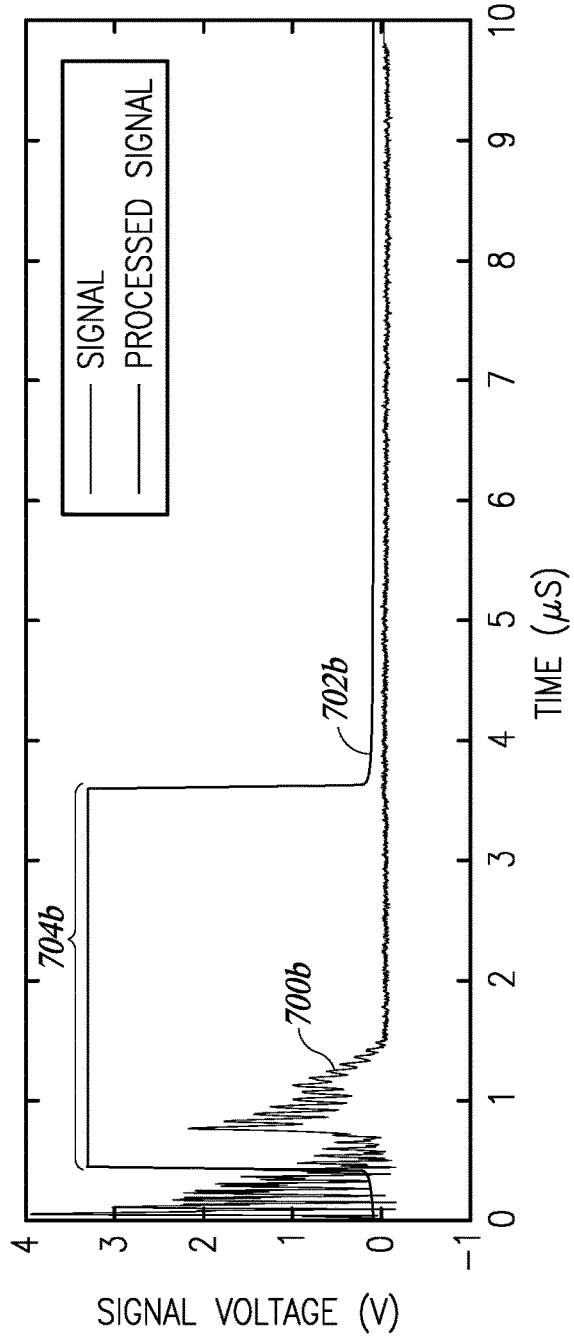
FIG. 7B is a graph showing a plot of another example of output of a pulse generator and an output signal of a comparator, illustrating a pulse duration for the output signal of the comparator, according to at least one illustrated implementation.

FIG. 7B shows a plot of an example output 700b of a pulse generator and an output signal 702b (i.e., Processed Signal) of a comparator, illustrating a pulse duration 704b of the output signal 702b, according to at least one illustrated implementation. If the comparator outputs a signal, the pulse duration 704b is measured by the microcontroller, and used as one piece of data or information in order to determine the type of discharge or discharge mode.

Figure 8:
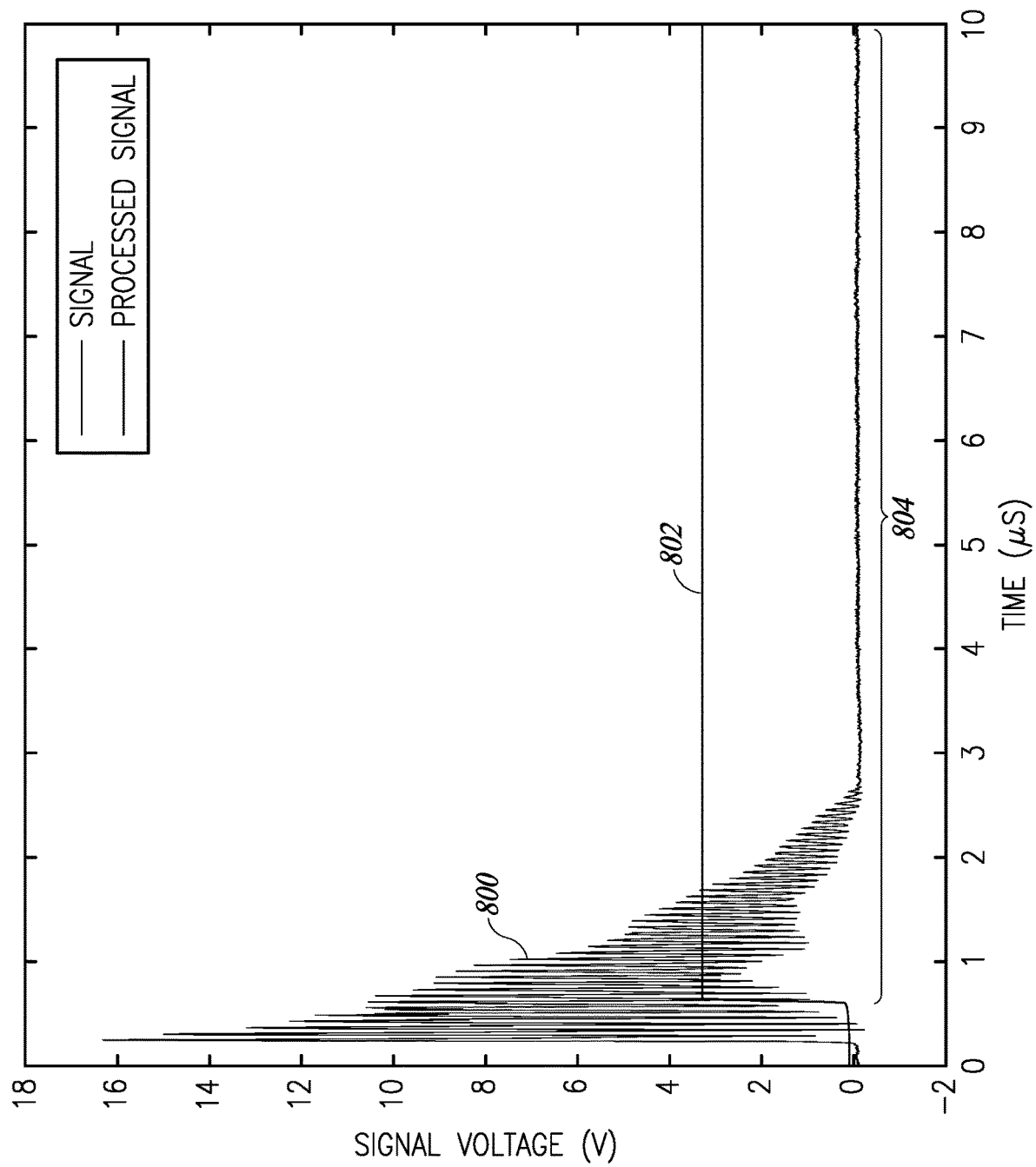
FIG. 8. is a graph that shows a plot of an example output of a pulse generator and an output signal of a comparator, illustrating a situation where a pulse duration of the output signal from the comparator exceeds a time available before it is time to generate another high voltage pulse.

FIG. 8. shows a plot of an example output 800 of a pulse generator and an output signal 802 (i.e., Processed Signal) of a comparator, illustrating a pulse duration 804 of the output signal 802, according to at least one illustrated implementation. In this example the pulse duration 804 of the output signal 802 of the comparator exceeds a time available before it is time to generate another high voltage pulse. In response, a dump circuit is used to discharge the capacitor, in this case so that the circuit is reinitialized to make a measurement of the next high voltage pulse. The example may be considered a borderline case, which is typically to be avoided during normal operation.

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one implementation, the present subject matter may be implemented via Application Specific Integrated Circuits (ASICs). However, those skilled in the art will recognize that the implementations disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

Those of skill in the art will recognize that many of the methods or algorithms set out herein may employ additional acts, may omit some acts, and/or may execute acts in a different order than specified.

In addition, those skilled in the art will appreciate that the mechanisms taught herein are capable of being distributed as a program product in a variety of forms, and that an illustrative implementation applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory.

The various embodiments described above can be combined to provide further embodiments. All of the above U.S. patents, U.S. patent application publications, U.S. patent applications, foreign patents, foreign patent applications and non-patent publications referred to in this specification and/or listed in the Application Data Sheet, including but not limited to commonly owned: U.S. provisional patent application 63/156,155; U.S. Pat. No. 10,072,629; U.S. patent application Ser. No. 16/254,140; U.S. patent application Ser. No. 16/254,146; U.S. patent application Ser. No. 12/703,078; U.S. provisional patent application 62/699,475; U.S. provisional patent application 62/844,587; U.S. provisional patent application 62/844,574; and U.S. patent application Ser. No. 16/861,658, are each incorporated herein by reference, in their entirety.

Aspects of the implementations can be modified, if necessary, to employ systems, circuits and concepts of the various patents, applications and publications to provide yet further implementations.

The various embodiments and examples described above are provided by way of illustration only and should not be construed to limit the claimed invention, nor the scope of the various embodiments and examples. Those skilled in the art will readily recognize various modifications and changes that may be made to the claimed invention without following the example embodiments and applications illustrated and described herein, and without departing from the true spirit and scope of the claimed invention, which is set forth in the following claims. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

We claim:

1. A method of operation of a system for use in providing high voltage electrical pulses to one or more electrodes, the method comprising:
for each of a number of electrical pulses in a pulse train of electrical pulses being delivered to at least one electrode,
sensing at least one characteristic value of a present one of the electrical pulses of the pulse train; and
determining a transient discharge mode based on the sensed at least one characteristic value of the present one of the electrical pulses of the pulse train, wherein determining a transient discharge mode based on the sensed at least one characteristic value of the present one of the electrical pulses includes determining the transient discharge mode via an output of an amplitude-to-time conversion (ATC) circuit, and wherein the transient discharge modes include: a no detected discharge mode, a transient or non-equilibrated plasma discharge mode, and a spark or arc discharge mode, and determining the transient discharge mode via an output of an ATC circuit includes determining whether the no detected discharge mode occurred, the transient or non-equilibrated plasma discharge mode occurred, or the spark or arc discharge mode occurred.

2. The method of claim 1 wherein determining the transient discharge mode via the output of the ATC circuit includes determining whether a discharge has been detected for the present one of the electrical pulses of the pulse train, and in response to no detection of a discharge producing an indication that the transient discharge mode of the present one of the electrical pulses of the pulse train is the no detected discharge mode, and wherein determining the transient discharge mode via the output of the ATC circuit includes, in response to a detection of an occurrence of a discharge for the present one of the electrical pulses of the pulse train, determining whether a delay in a processed version of the present one of the electrical pulses provided by a comparator exceeds a delay of a reference signal.

3. The method of claim 2 wherein determining the transient discharge mode via the output of the ATC circuit further includes, in response to a detection of an occurrence of a discharge for the present one of the electrical pulses of the pulse train, determining whether a duration in the processed version of the present one of the electrical pulses provided by the comparator exceeds a duration of the reference signal, the processed version of the present one of the electrical pulses filtered via a resistance-capacitance filter.

4. The method of claim 2, further comprising:
producing, by the ATC circuit, a pulse width modulated (PWM) output signal that is indicative of the determined transient discharge mode.

5. The method of claim 4 wherein producing a PWM output signal that is indicative of the determined transient discharge mode by the ATC circuit includes producing the PWM output signal by a unipolar ATC circuit.

6. The method of claim 4 wherein producing a PWM output signal that is indicative of the determined transient discharge mode by the ATC circuit includes producing the PWM signal by a bipolar ATC circuit.

7. The method of claim 1, further comprising:
identifying the discharge mode of the present one of the electrical pulses of the pulse train by a microcontroller based on the output of the ATC circuit before the subsequent one of the electrical pulses of the pulse train is generated using time measurements.

8. The method of claim 1, further comprising:
adjusting at least a subsequent one of the pulses of the pulse train based at least in part on the determined transient discharge mode,
wherein adjusting at least a subsequent one of the pulses of the pulse train based at least in part on the determined transient discharge mode includes adjusting at least one of: a pulse amplitude at least one of the subsequent one of the pulses, a pulse repetition rate of the at least one of the subsequent one of the pulses, or an end of the pulse train or a number of the at least one of the subsequent one of the pulses in a pulse burst in the pulse train.

9. The method of claim 1 wherein sensing at least one characteristic value of a present one of the electrical pulses of the pulse train includes sensing at least one of a voltage or a current of the present one of the electrical pulses of the pulse train at one or more of: an output of a pulse generator, a cable/igniter interface or cable/sparkplug interface, or a location along a cable that connects the pulse generator to an igniter or a sparkplug.

10. The method of claim 1 wherein sensing at least one characteristic value of a present one of the electrical pulses of the pulse train includes sensing at least one of a voltage or a current of the present one of the electrical pulses of the pulse train reflected from a load.

11. The method of claim 1 wherein adjusting an amplitude of a subsequent one of the pulses based on the determined transient discharge mode includes adjusting the amplitude of the subsequent electrical pulse via a pulse width modulated charging circuit selected from the group consisting of: a pulse width modulated half-bridge charging circuit powered by a DC-DC power supply and a pulse width modulated full-bridge charging circuit powered by a DC-DC power supply.

12. The method of claim 1 wherein determining the transient discharge mode based on the sensed at least one characteristic value of the present one of the electrical pulses includes determining the transient discharge mode via an output of a first amplitude-to-time conversion (ATC) circuit and via an output of a second ATC circuit, the first ATC circuit coupled to receive at least one of a voltage or a current of the present one of the electrical pulses of the pulse train sensed at a first one of: an output of a pulse generator, a cable/igniter interface or cable/sparkplug interface, or a location along a cable that connects the pulse generator to an igniter or a sparkplug, and the second ATC circuit coupled to receive at least one of a voltage or a current of the present one of the electrical pulses of the pulse train sensed at a second one of: an output of a pulse generator, a cable/igniter interface or cable/sparkplug interface, or a location along a cable that connects the pulse generator to an igniter or a sparkplug.

13. A system for use in providing high voltage electrical pulses to one or more electrodes, the system comprising:
at least one sensor positioned and operable to sense at least one characteristic value of a present one of a plurality of electrical pulses of a pulse train of electrical pulses; and
circuitry communicatively coupled to the at least one sensor and operable to determine a transient discharge mode of the present one of a plurality of electrical pulses of a pulse train based on the sensed at least one characteristic value of the present one of the electrical pulses of the pulse train;
wherein the circuitry includes an amplitude-to-time conversion (ATC) circuit that produces a pulse width modulated (PWM) output signal that is indicative of the determined transient discharge mode, the circuitry includes a microcontroller communicatively coupled to the ATC circuit to receive the PWM output signal produced by the ATC circuit, and the circuitry determines whether a discharge has been detected for the present one of the electrical pulses of the pulse train, and in response to no detection of a discharge the circuitry produces an indication that the transient discharge mode of the present one of the electrical pulses of the pulse train is the no detected discharge mode and wherein, in response to a detection of an occurrence of a discharge for the present one of the electrical pulses of the pulse train, the circuitry determines whether a delay in a processed version of the present one of the electrical pulses provided by a comparator exceeds a delay of a reference signal.

14. The system of claim 13 wherein the ATC circuit is one of a unipolar ATC circuit or a bipolar ATC circuit.

15. The system of claim 13 wherein, in response to a detection of an occurrence of a discharge for the present one of the electrical pulses of the pulse train, the circuitry determines whether a duration in the processed version of the present one of the electrical pulses provided by the comparator exceeds a duration of the reference signal, the processed version of the present one of the electrical pulses filtered via a resistance-capacitance filter, and wherein the microcontroller identifies the discharge mode of the present one of the electrical pulses of the pulse train based on the output of the ATC circuit before the subsequent one of the electrical pulses of the pulse train is generated using time measurements.

16. The system of claim 15 wherein the circuitry further adjusts at least a subsequent one of the pulses of the pulse train based at least in part on the determined transient discharge mode and wherein to adjust at least a subsequent one of the pulses of the pulse train based at least in part on the determined transient discharge mode the circuitry adjusts at least one of: a pulse amplitude at least one of the subsequent one of the pulses, a pulse repetition rate of the at least one of the subsequent one of the pulses, or an end of the pulse train or a number of the at least one of the subsequent one of the pulses in a pulse burst in the pulse train.

17. The system of claim 15 wherein the circuitry further adjusts at least a subsequent one of the pulses of the pulse train based at least in part on the determined transient discharge mode and wherein to adjust at least a subsequent one of the pulses of the pulse train based at least in part on the determined transient discharge mode the circuitry adjusts an amplitude of the subsequent electrical pulse via a pulse width modulated charging circuit selected from the group consisting of: a pulse width modulated half-bridge charging circuit powered by a DC-DC power supply and a pulse width modulated full-bridge charging circuit powered by a DC-DC power supply.

18. The system of claim 13 wherein the at least one sensor is positioned and operable to sense at least one of a voltage or a current of the present one of the electrical pulses of the pulse train at one or more of: an output of a pulse generator, a cable/igniter interface or cable/sparkplug interface, or a location along a cable that connects the pulse generator to an igniter or a sparkplug.

19. The system of claim 13 wherein the at least one sensor is positioned and operable to sense at least one of a voltage or a current of the present one of the electrical pulses of the pulse train reflected from a load.

20. The system of claim 13 wherein the ATC circuit is a first ATC circuit coupled to receive at least one of a voltage or a current of the present one of the electrical pulses of the pulse train sensed at a first one of: an output of a pulse generator, a cable/igniter interface or cable/sparkplug interface, or a location along a cable that connects the pulse generator to an igniter or a sparkplug, and further comprising:
a second ATC circuit coupled to receive at least one of a voltage or a current of the present one of the electrical pulses of the pulse train sensed at a second one of: an output of a pulse generator, a cable/igniter interface or cable/sparkplug interface, or a location along a cable that connects the pulse generator to an igniter or a sparkplug.

* * * * *